(12) United States Patent
Hackler et al.

(10) Patent No.: US 8,349,185 B2
(45) Date of Patent: Jan. 8, 2013

(54) METHOD FOR REBALANCING A MULTICOMPONENT SOLVENT SOLUTION

(75) Inventors: Mark A. Hackler, Ocean, NJ (US); Rajgopal Subramanian, Robbinsville, NJ (US)

(73) Assignee: E I du Pont de Nemours and Company, Wilmington, DE (US)

( * ) Notice: Subject to any disclaimer, the term of this patent is extended or adjusted under 35 U.S.C. 154(b) by 4 days.

(21) Appl. No.: 12/908,475

(22) Filed: Oct. 20, 2010

(65) Prior Publication Data

US 2012/0100489 A1    Apr. 26, 2012

(51) Int. Cl.
*B01D 11/00*    (2006.01)
*G03C 5/08*    (2006.01)

(52) U.S. Cl. ......... 210/634; 203/39; 210/639; 210/739; 210/742; 210/767; 210/774; 210/787; 210/806; 430/398; 430/399; 700/265; 700/273; 702/55; 702/156; 366/152.1; 366/152.2

(58) Field of Classification Search .................. 210/634, 210/639, 739, 767, 787, 742, 774, 806; 430/300, 430/309, 331, 398, 399; 700/67, 68, 265, 700/273; 702/50, 55, 156; 203/39; 366/152.1, 366/152.2
See application file for complete search history.

(56) References Cited

U.S. PATENT DOCUMENTS

| | | | |
|---|---|---|---|
| 3,189,530 A | | 6/1965 | Orr |
| 3,930,258 A | * | 12/1975 | Dick et al. ................. 347/7 |
| 4,388,864 A | * | 6/1983 | Warner ...................... 101/148 |
| 4,494,209 A | * | 1/1985 | Agarwal ...................... 700/265 |
| 4,743,380 A | | 5/1988 | Royse |
| 5,124,736 A | | 6/1992 | Yamamoto et al. |
| 5,308,452 A | | 5/1994 | Marks et al. |
| 5,598,251 A | | 1/1997 | Parish et al. |
| 5,759,743 A | | 6/1998 | Muramoto et al. |
| 5,828,923 A | | 10/1998 | Harabin et al. |
| 6,164,845 A | * | 12/2000 | Earle et al. ................. 396/568 |
| 6,251,228 B1 | | 6/2001 | Marks et al. |
| 6,446,644 B1 | * | 9/2002 | Dolechek .................... 134/57 R |
| 6,682,877 B2 | | 1/2004 | Wyatt et al. |
| 7,214,537 B2 | | 5/2007 | Stevens et al. |
| 2003/0202822 A1 | * | 10/2003 | Viturro et al. ................. 399/223 |
| 2003/0211429 A1 | * | 11/2003 | Fiebag et al. ................. 430/398 |
| 2006/0054560 A1 | | 3/2006 | Hendrickson et al. |
| 2006/0166146 A1 | * | 7/2006 | Miller et al. ................. 430/399 |
| 2006/0217450 A1 | | 9/2006 | Hendrickson et al. |
| 2007/0106425 A1 | * | 5/2007 | Anderson et al. ............ 700/265 |
| 2008/0128368 A1 | | 6/2008 | Hendrickson et al. |
| 2010/0213128 A1 | | 8/2010 | Bradford et al. |

FOREIGN PATENT DOCUMENTS

EP    0 482 447 B1    2/1997

OTHER PUBLICATIONS

Liu, Sean X. and Peng, Ming, "The Simulation of the Simple Batch Distillation of Multiple-Component Mixtures Via Rayleigh's Equation", pp. 198-204, accepted May 8, 2006; published 2007.
"DuPont Cyrel® Flexographic Printing Plates and Equipment Manual", pp. 1-25, circa early 1990's.
"DuPont™ Cyrel® Global Process-of-Use Manual", 2008. (Including Charts for Rebalancing).

* cited by examiner

*Primary Examiner* — Joseph Drodge

(57) ABSTRACT

The invention pertains to a method for rebalancing a solvent solution useful for treating photosensitive printing elements having a photopolymerizable layer. The solvent solution becomes contaminated with unpolymerized material and other materials that release from the photosensitive printing elements during washout treating, and separation of contaminates also removes some of one or more components in the used solvent solution. The method rebalances the proportion of the components in a solvent solution having 3 or more components. The method includes measuring a reclaimant, which has been separated from the contaminates, for two or more properties, calculating a mass of the components to be added to the reclaimant based on an equation generated for each measured property, and adding the mass of the component or components to the reclaimant to adjust the proportion of the components in the reclaimant to targeted proportions.

19 Claims, No Drawings

US 8,349,185 B2

METHOD FOR REBALANCING A MULTICOMPONENT SOLVENT SOLUTION

BACKGROUND OF THE INVENTION

1. Field of the Disclosure

This invention pertains to a method for rebalancing a solvent solution useful for treating a photosensitive printing element.

2. Description of Related Art

Flexographic printing plates are widely used for printing of packaging materials ranging from corrugated carton boxes to cardboard boxes and to continuous web of plastic films. Flexographic printing plates are used in relief printing in which ink is carried from a raised-image surface and transferred to a substrate. Flexographic printing plates can be prepared from photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a solid layer of the photopolymerizable composition interposed between a support and a coversheet or a multilayer cover element. The photosensitive element usually includes a release layer to facilitate release of the coversheet and/or a mask film. The photosensitive elements are characterized by their ability to crosslink or cure upon exposure to actinic radiation. Typically, the element is imagewise exposed to actinic radiation, such as ultraviolet (UV) radiation, through a mask to form exposed areas of the photopolymerizable layer that crosslink or cure and unexposed areas, i.e., unpolymerized material, of the photopolymerizable layer that do not crosslink or harden. Since the unexposed areas remain soluble to solvents and the exposed areas become insoluble to solvents, the imagewise exposed element is washed or developed in a solvent which can remove the unpolymerized area while leaving the polymerized (cured) material intact. The solvent solution may be applied to the photosensitive element in any convenient manner such as by pouring, immersing, spraying, or roller application. Brushing can facilitate the solvent washout process and aid in the removal of the unpolymerized or uncrosslinked portions of the composition.

Preparation of Relief Printing Forms by Development of the photopolymerizable element with washout solutions is well known. Solvent developers typically used in such processes include chlorohydrocarbons, such as trichloroethylene or tetrachloroethylene; aromatic hydrocarbons, such as benzene or toluene; saturated cyclic and acyclic hydrocarbons, such as hexane and cyclohexane; unsaturated cyclic hydrocarbons, such as terpenoid compounds, and lower aliphatic ketones. The solvents may be used alone, in combination, or in a mixture with a non-solvent, i.e., a material that does not dissolve the unpolymerized material. In some cases, the washout or development solution is a mixture of a solvent (to the unpolymerized material) and the non-solvent is an alcohol which aids in the removal of the material forming the release layer, and/or suppress swelling of the photosensitive resin composition cured by exposure to actinic radiation.

A recent trend in development solutions is the composition to have more than two components. Such multi-component development solutions can include additional components to reduce the cost of the development solution, and/or provide additional features or functionality to the development solution, and/or provide features for the photosensitive element. For example, diluents can be used to reduce the cost of the development solution and/or lower odor. Surfactants can be used to stabilize development solution mixture, and/or minimize removed materials from adhering back to the printing form. Fluoropolymers and/or silicone compounds can be used to aid in the ink release and/or clean printing of the resulting printing form.

With use, the development solution becomes contaminated with unpolymerized material and other materials that release from the photosensitive element during development or washout. To reduce costs and environmental impact, it is desirable to recycle the development solution for subsequent development processes. In many cases, contaminated development solution is distilled to separate the contaminants, i.e., unpolymerized material and other materials, from the reclaimant solution of the solvent and optional non-solvent. In some cases, contaminated development solution is mechanically separated by centrifuge and optionally filtration to separate the contaminants from the reclaimant solution.

However, when the development solution is composed of two or more components a problem arises with the use of the reclaimant solution in that the proportion of the components in the reclaimant solution is oftentimes different than the proportion of the components in the starting or fresh development solution, that is, the reclaimant solution is out-of-balance. Loss of the components can be the result from the particular process used to recover the development solution. Also, the separated contaminates, i.e., unpolymerized material, can retain some of the solvent component or other components from the development solution. Although the reclaimant solution having different proportions of components (than the proportions of components in a fresh development solution) may still be capable of removing material from photosensitive elements, its effectiveness at removing materials from photosensitive elements would diminish over time and with continued reuse of the reclaimant solution. Washout with a development solution that is out of balance can result in incomplete removal of unpolymerized material from the photosensitive element such that relief areas in the photosensitive element are not fully formed or incomplete removal of one or more other layers, such as a release layer, of the photosensitive element. Time in the development solution may increase to compensate for incomplete removal. But increased development time generally also increases the time that the photosensitive element undergoes brushing, which can lead to mechanical damage to the relief structure of the resulting print form. Increase development time can also increase the swelling of the photosensitive element by the solvent, and hence longer drying times as well. Usually performance of the development system is optimum when the proportions of the components in the development solution are maintained relatively constant rather than fluctuate within a possible operating window.

In order to maintain the proportions of the components in the development solution and its effectiveness at removing materials from the photosensitive element, it is a common practice to "buckup" the reclaimant solution by adding typically one solution having one or more of the components (of the development solution) to the reclaimant solution that is recycled to the processor. In some cases fresh solvent solution that has all components of the starting solvent solution is added to the cleaned solvent solution to replenish the washout solution in the processor. The buckup solution may contain only the solvent component of the development solution or, a mixture of the solvent component and other component/s in proportions that reflects average use of the development solution. But the development solution can be used to process different sizes and types of photosensitive elements each having different photopolymerizable compositions each with different affinity for the solvent and other components in the development solution. As a result, each customer may have a distinct reclaimant solution (and mix of development solution and reclaimant) based at least on the mix of photosensitive elements processed, the process used to recover the reclaimant, and the developer solution composition. As such, a buck-up solution having proportions of components based upon an average processing system may not sufficiently correct the reclaimant solution to an effective development solution.

In some cases a user measures one property, such as specific gravity or refractive index, of the reclaimant solution to determine if the buck-up solution should be added and if so, the amount of the buck-up solution to add. The measurement of the one property determines if the reclaimant solution falls within an operating window of a certain range of compositions that may be effective when recycled to the processor. With a two component development solution, measurement of one property of the reclaimant solution that varies as the ratio of the two components changes infers the ratio of the two components in the solution. The amount of buck-up solution that can be added to the reclaimant to bring it to a target composition can be determined from a look-up table based on the composition of the reclaimant and the total volume of the system. But measurement of only one characteristic of the reclaimant solution is not indicative of the proportions of each of the components particularly when the development solution (and reclaimant solution) contains three or more components. This method typically cannot correctly rebalance multi-component solvent solutions to bring all the components within a desired operational composition.

One way to determine if a development solution that is composed of 3 or more components is out of balance is to send samples of the solution for complex analytical testing at a remote location. However, this is time consuming and expensive, and can delay production of printing forms.

In view of the above problems, there arises a need to provide customers that prepare printing forms with an easy, in-house, method that provides immediate feedback to the status of the balance of components in a development solution and/or a reclaimant solution. The method should also provide guidance to the addition/s of buckup solution/s or fresh component solution/s necessary to maintain the proportions of the components in the development solution and/or the reclaimant solution for effective removal of materials from the photosensitive element.

SUMMARY

This invention provides a method for rebalancing a solvent solution used for treating a photosensitive printing element having a photopolymerizable layer with an unpolymerized portion. One embodiment of the method comprises a) providing a solvent solution that is a mixture of n components, wherein $n \geq 3$, wherein each of the components has a first mass fraction, based on a total of the first mass fractions of the components; b) collecting the solvent solution with the unpolymerized portion therein; c) separating the unpolymerized portion from the solvent solution of step b) to form a reclaimant of the components, wherein at least one the components of the reclaimant has a second mass fraction that is different than the first mass fraction; d) determining a volume of the reclaimant; e) measuring the reclaimant for n−1 properties; f) calculating a mass of at least one of the components to be added to the reclaimant based on an equation generated for each measured property of step e) relative to each of the components, and based on a total of the second mass fractions of the components in the reclaimant sum to one (1); and, g) adding the mass of at least one of the n components from step f) to the volume of reclaimant, thereby adjusting the second mass fraction of each of the components in the reclaimant to a target mass fraction.

DESCRIPTION OF THE PREFERRED EMBODIMENTS

The present invention is a method for rebalancing a solvent solution that is used for treating recording materials, such as photosensitive elements having at least one photopolymerizable layer. The photosensitive elements may also be referred to herein as photosensitive printing elements, photopolymerizable elements, or photopolymerizable printing elements. The photopolymerizable layer contains at least a polymeric binder, photopolymerizable monomer, and a photoinitiator, and optionally additives. The photopolymerizable layer includes at least one unpolymerized portion, typically a plurality of unpolymerized portions that is removed by treating with the solvent solution. The unpolymerized portion/s are non-crosslinked portion/s of the photopolymerizable layer, and in most embodiments the unpolymerized portion/s are unexposed portion/s of the photopolymerizable layer.

The solvent solution has a composition that includes 3 or more components, that is, the solvent solution is a multi-component solvent solution. The 3 or more components in the solvent solution each provide one or more functions in the transformation of the photosensitive element to a print form having a surface suitable for printing. Generally materials removed from the photosensitive element by the solvent solution, such as polymeric material or other materials, are not considered a component of the solvent solution. Because the solvent solution becomes contaminated with unpolymerized portion/s and other materials from the photosensitive element, the present method provides for the recovery of the contaminated solvent solution for reuse or recycling. Rebalancing encompasses adjusting the proportions of the components in a reclaimed solution to a target composition of proportions that assures continued effective removal of materials from photosensitive elements by development. The recovery method of contaminated solvent solution can include separating reclaimant solution from the contaminants, and rebalancing the components in the reclaimant solution. Rebalancing the reclaimant adjusts the components of the reclaimant solution based upon measurements of two or more properties of the reclaimant solution and use of at least three or more equations generated from experimental solvent solution compositions. The equations represent relationships derived from each of the measured properties and experimental solvent solutions having various compositions of differing proportions of each of the components in the solvent solution. Adjusting the components of the reclaimant solution adds one component, usually two or more components, to the reclaimant solution in an amount to bring the proportion of each of the components in the reclaimant solution to a targeted composition. Rebalancing a solvent solution substantially ensures continued effective removal of material/s from photosensitive elements by the reclaimant solution. The method is particularly useful for recovery of multi-component solvent solutions, that is solvent solutions (and reclaimant solutions) having a mixture of 3 or more components, since these solutions cannot typically be rebalanced correctly using prior methods that measures one property and uses a look-up table to determine the adjustment required with a buck-up solution.

In one embodiment, rebalancing of a solvent solution can be renewal of a solvent solution that has a composition in which proportions of the three or more components have shifted from their initial proportions, by making amendments to the solvent solution that adjust the composition to a targeted composition that continues effective removal of material/s from photosensitive printing elements. In another embodiment, rebalancing of a solvent solution can be renewal of a solvent that has a composition in which proportions of the three or more components have shifted from their initial proportions and has been contaminated with materials from photosensitive elements, by separating the contaminants from the solvent and making amendments to the solvent solution that adjust it to a targeted composition state that provides for effective removal of material/s from photosensitive printing elements. The targeted composition state in most cases is free or substantially free of the contaminants. The targeted composition has the proportion of the three or more components that may be the same or substantially the same as the proportion of the components of the initial solvent solution, or, that may be within a desired range of proportions of the components that is suitable for effective removal of material/s from photosensitive printing elements.

The present method avoids the need to send samples of the reclaimant for analysis to a laboratory for measurement by complex analytical test methods and delays in receiving the test results, and provides immediate feedback to the status of the balance of components in a development solution and/or a reclaimant solution. The method is easy and uses simple field devices for measuring of the properties of the reclaimant solution. The method also determines the addition/s of buck-up solution/s or fresh component solution/s necessary to maintain the proportions of the components in the development solution and/or the reclaimant solution for continued effective removal of materials from the photosensitive element. The present method of rebalance of solvent solutions maintains the performance of systems for preparing printing forms that treat with liquid solvent solutions. The method can maintain for an extended time the solvent solution composition within a targeted window of proportions of components in which the solvent solution is effective at removing materials from the photosensitive element (and providing suitable print form). The tendency to alter washout process conditions, such as, increasing washout time, in order to compensate for ineffective removal by (an out-of-balance) solvent solution is avoided. A solvent solution composition that is maintained within a targeted window thus maintains efficiency of operation and reduces the possibility of damaging the relief structure of the resulting printing form, such as chipping of fine features and highlite dots. The present method of rebalancing solvent solutions reduces the impact of waste solvent solution on the environment since users can avoid the need to replace used solvent solution compositions in which the proportion of components has deviated such that it is no longer effective at removing material/s from the photosensitive element.

Treating with a solvent solution to remove unpolymerized material and other materials from the photosensitive element can be referred to as washout, washing out, development, or developing of the photosensitive element. Treating forms a relief surface in the resulting printing form that is suitable for printing. The solvent solution may also be referred to as a developer solvent, a developing solvent or solution, or developer. The solvent solution is a liquid mixture of three or more components. The solvent solution has at least one component which is sufficient at dissolving some or all of particular material or materials from a photosensitive element to render the element suitable for use. In most embodiments, providing the solvent solution is by having the solvent solution present in an apparatus suitable for washout treating, such as a processor or washout device. The type of processor used and the method of contacting the solvent solution to the photosensitive element are not limited provided that the solvent solution, alone or with mechanical action, such as brushing, removes of the unpolymerized and additional materials from the photosensitive element to create a relief surface in the resulting printing form. The solvent solution may be applied to the photosensitive element in any convenient manner such as by pouring, immersing, spraying, or roller application. Brushing can facilitate the solvent washout process by aiding the removal of the unpolymerized portion/s of the photopolymerizable composition. The operation of the processor and the use of the solvent solution in the processor can be conducted in batch mode or continuous mode according to the needs of the system and/or user. The processor system, which includes a tank in the processor, a clean solvent reservoir, and a contaminated solvent reservoir, has a total volume of the solvent solution that is suitable for washout of photosensitive elements. The reservoirs may be part of the processor or may be other suitable solvent storage containers such as a drum or tote. The processor intakes clean solvent solution and ejects contaminated solvent solution as needed. The reclamation process includes the use of the clean reservoir and contaminated reservoir, as well as a separation unit, such as a heated distillation vessel or other device, to remove contaminants from the solvent solution.

The solvent solution is a mixture composed of n components, wherein n equals or is greater than 3, and each component has a mass fraction, based on a total of the mass fractions of the n components in the solvent solution. The total of the mass fractions of the n components is 1 (i.e., total 100% by weight). The solvent solution is a mixture of the n components since each component in the solution retains its own chemical identity without any chemical bonding between the components. The mass fraction of each of the components in a solvent solution evolves over the life of the solution in the processing system. Each of the 3 or more components of the solvent solution in a fresh or unused state has a first mass fraction, wherein the total of the first mass fraction of the components equals 1 (that is, total 100% by weight). In most embodiments, the solvent solution having n components with the first mass fraction will be initial charge of solvent solution in the processor with fresh or unused solvent solution. In other embodiments, the solvent solution having n components with the first mass fraction will be recovered solvent solution that has been rebalanced according to the present method, and optionally can be added to a solvent solution (which may be fresh or slightly used) present in the processor.

In most embodiments, the number of components, n, in a multi-component solvent solution is 3 and includes a first active component, a second active component, and a diluent. In yet other embodiments, the number of components in a multi-component solvent solution is 3 and includes two first active components, and a second active component. In some embodiments, the number of components, n, in a solvent solution is 4, and can include a first active component, a second active component, a diluent, and a surfactant. In other embodiments, where the number of components is 4 or more, the solvent solution will be composed of at least one first active component, at least one second active component, and 2 or more other components that provide complementary functional utility such as odor masking, solubility enhancement, safety i.e., antistatic agent, and/or promote chemical compatibility, i.e., surfactants.

The first active component removes unpolymerized material from the photopolymerizable layer of the photosensitive element. In most cases, the first active component is a good solvent for the matrix polymer that sufficiently removes the unpolymerized material by dissolution of the unpolymerized material into the solvent solution. However, removal is not limited to dissolution and removal can include loosening, lifting, or separating the unpolymerized material from the element, or suspending the unpolymerized material in the solvent solution. The first active component, and optionally the second active component and/or one or more of the additional functional utility components may cause the polymerized or cured portion or portions of the photosensitive element to swell while undergoing washout process. A solvent solution may contain one first active component, or two or more first active components which are complementary to each other.

Materials suitable as the first active component are hydrocarbons, which include but are not limited to, chlorohydrocarbons, such as trichloroethylene, perchloroethylene, or trichloroethylene; aromatic hydrocarbons, such as benzene, and toluene, which can be substituted or unsubstituted; saturated cyclic hydrocarbons and saturated acyclic hydrocarbons, such as petroleum ether, hexane, heptane, and cyclohexane; unsaturated cyclic hydrocarbons, such as terpenoid compounds; and lower aliphatic ketones, such as acetone, methyl ethyl ketone, methyl isobutyl ketone. In one embodiment the first active component can be selected from alkyl esters having the general formula RCOOR' where R can be any organic moiety and R' is an alkyl group preferably having 1-12 carbon atoms. R' can also be a linear or branched alkyl group. The alkyl esters include but are not limited to methyl esters, ethyl esters, propyl esters, butyl esters, pentyl esters, hexyl esters, octyl esters, nonyl esters, decyl esters, undecyl esters, dodecyl esters and any branched compound thereof. Alkyl esters suitable for use include but are not limited to alkyl esters of fatty acids with 6-18 carbon atoms. In other embodiments, the first active component can be selected from aliphatic esters, such as acetic acid esters of alcohols, acetic acid esters of alkoxy-substituted alcohols, carboxylic acid esters of alcohols, and carboxylic acid esters of alkoxy-substituted alcohols. In another embodiment, the first active component can be selected from monoterpenes; terpene esters, such as terpinyl acetate, terpinyl formate, isobornyl acetate isobornyl formate; terpene ethers, such as terpenyl alkyl ether, fenchyl alkyl ether, limonyl alkyl ether, wherein the alkyl group has from 1-18 carbons. In yet another embodiment, the first active component can be selected from methyl phenyl ether and ethyl phenyl ether.

The first active component is present in the solvent solution from about 30 to 70% (and a mass fraction of 0.30 to 0.70), based upon the total weight mass of the solvent solution. Solvent solutions containing two or more first active components can be from 40 to 80% by weight.

A second active component may be present to at least remove material or materials from one or more additional layers from the photosensitive element. In most embodiments, the second active component is considered a nonsolvent for the matrix polymer, that is, a component that does not dissolve or act to remove the unpolymerized material. However, in some embodiments the second active component may also function as a moderate solvent to the unpolymerized material. Ethyl ethoxy-propionate is one example of a moderate solvent for both the unpolymerized material and other materials of the photosensitive element. But as a moderate solvent, aggressive processing conditions, such as very high temperature of the solvent solution or excessively long washout times, may be necessary in order to assure sufficient washout of the material from the photosensitive element. In most cases, removal of the material/s from the one or more additional layers dissolves the additional materials into the solvent solution, but removal with the second active component can include loosening, lifting, or separating the additional materials from the photosensitive element, or suspending the additional materials into the solvent solution. In most embodiments, the second active component removes additional material/s from one or more layers of the photosensitive element other than the photosensitive layer since the additional materials are not soluble or only slightly soluble in the first active component. In most embodiments, the second active component is an alcohol. The alcohol as the second active component removes material that forms the release layer of the photosensitive element. In other embodiments, the alcohol removes material/s of a layer that is not a release layer but the layer has another function for the photosensitive element, such as a digitally-imagable masking layer. The alcohol is not particularly limited provided that it is suitably effective at removing the other materials from the photosensitive element during typical washout treating cycle.

Alcohols suitable for use as the second active component include, but are not limited to, aliphatic alcohols, alicyclic alcohols, aromatic alcohols, heterocyclic alcohols, polycyclic alcohols, trihydric alcohols, and polyhydric alcohols. In some embodiments, the alcohol can be an alkyl alcohol having at least 4 carbon atoms. In other embodiments, the alcohol can be an aromatic alcohol, such as benzyl alcohols, and phenols. Some non-limiting examples of suitable alcohols include isopropanol; isoheptanol; isoocatanol; isononanol; 2-ethylhexanol 2-ethoxyethanol; butyl alcohol; alpha terpineol; dipropylene glycol methyl ether; 2-butoxyethanol; 2-(2-butoxyethoxy)ethanol; cyclopentanol; and cyclohexanol. Mixtures and combinations of alcohols can also be used. Commercially available mixtures of alcohols include Exxal™ alcohols, which are mixtures of branched primary alcohols, from ExxonMobil. In most embodiments, the alcohol has a boiling point equal to or greater than 135° C., and consequently a low vapor pressure at room temperature.

The solvent solution may include an alcohol as the second active ingredient from 0 to about 40%, by weight based on the total of the solvent solution. In most embodiments, the alcohol is present in the solvent solution from about 1 to about 40% (0.01 to 0.40 mass fraction), and more likely from about 10 to about 40% (0.10 to 0.40 mass fraction), by weight of the solvent solution.

Besides their effectiveness at removing respective materials from the photosensitive element, selection of the first active component and the second active component for the solvent solution may be based on one or more additional factors including, but not limited to, vapor pressure, flash point, boiling point, compatibility with other components in the mixture, ozone depleting activity, toxicity, cost, and stability in solution and/or storage.

The diluent is selected to be compatible with the first active component and the second active component, and is used to reduce the concentration of the active components in the solvent solution. Since the active components are operable at the concentration ranges indicated, the presence of a diluent reduces the cost of the solvent solution, and may help to reduce swelling of the photosensitive element resulting from contact with the solvent solution. However, for optimum washout performance by the solvent solution the ratio of the first active component to the second active component should be the same or substantially the same whether or not diluent(s) is (are) present in the solvent solution. Optionally, it would be beneficial to select a diluent that may have some small activity in the removal of the unpolymerized material and/or of other additional materials, i.e., "moderate solvent", of the photosensitive element, but its presence alone is not sufficient to remove the materials from photosensitive elements. As such, there may be some overlap with materials suitable as the diluent with those materials suitable as the first active ingredient. In some embodiments, the diluent can be odorless or have an odor that is less than the odor of the active component/s. Materials suitable as the diluent, include but are not limited to, petroleum distillates, naphthas, paraffinic solvents, hydrotreated petroleum distillates, mineral oil, mineral spirits, ligroin, decane, octane, and hexane. In some embodiments the diluent is a hydrogenated petroleum fraction, having an aromatics content of less than about 1%. Hydrogenated petroleum fractions are commercially available under the tradenames of Shellsol® and Exxsol®. Isoparaffinic solvents are commercially available in a wide range of volatility and corresponding flash points.

The solvent solution may include a diluent from 0 to about 50%, by weight based on the total of the solvent solution. In most embodiments, the diluent is present in the solvent solution from about 1 to 50% (0.01 to 0.5 mass fraction), most likely from about 15 to about 40% (0.15 to 0.40 mass fraction), by weight based upon the total weight of the solvent solution.

Examples of suitable solvent solutions having at least first and second active ingredients are disclosed in U.S. Pat. No. 4,806,452; U.S. Pat. No. 4,847,182; U.S. Pat. No. 5,061,606; U.S. Pat. No. 5,116,720; U.S. Pat. No. 5,128,234; U.S. Pat. No. 5,176,986; U.S. Pat. No. 5,240,815; U.S. Pat. No. 5,242,782; U.S. Pat. No. 5,252,432; U.S. Pat. No. 5,312,719; U.S. Pat. No. 5,354,645; U.S. Pat. No. 5,516,623; U.S. Pat. No. 5,521,054; U.S. Pat. No. 6,248,502; U.S. Pat. No. 6,582,886; U.S. Pat. No. 6,682,877; U.S. Pat. No. 6,897,008; and in US Patent Publications US 2003/0198900; US 2004/0091824; US 2004/0142282; US 2004/0152019; US 2007/0175235; US 2006/0040218; and in EPO publications EP 0 511 585 A1 and EP 0 542 254.

The solvent solution can include additional components which provide added functionality to the developer solvent or to the resulting printing form. The additional components can include surface active compounds which can accelerate dissolution of the unpolymerized material or maintaining the print form clean of debris, odor-masking agents, odor-improving compounds, anti-sludge agents which can reduce the buildup of sludge in the processor, antistatic agents which can reduce electrostatic attraction to the resulting printing form, and release agents which can aid in the release of ink and/or clean printing by the resulting printing form. Non-limiting examples of surface active compounds include alkyl-sulfonates and their salts, alkylammonium salts, oxyethylated fatty alcohols, fatty alcohol ether sulfates and their salts, and fatty alcohol phosphorus esters and their salts. Some terpinoid compounds such as limonene, pinene, citronellol may be useful as odor reducing agents. The fragrance industry provides a wide range of materials based on cyclohexanol and substituted cyclohexanols that may be provide odor reducing characteristics or be useful as an odor masking agent for solvent solutions. Fluoropolymers and/or silicone compounds can be used as release agents. Each of the additional components may be present from 0 to 10% by weight, based on the total weight of the solvent solution.

The solvent solution may contain more than one first active component, and/or more than one second active component, and/or more than one diluent. It is also contemplated that the solvent solution contains more than one first active component, and at least one second active component, but no diluent. Provided that each component has discernable different values for measured properties, the present method is useful for rebalancing the solvent solution having different combinations of at least 3 components. Although the present method is described relative to photosensitive elements in which the unpolymerized material is removable by washout in organic solvent development solution, it is contemplated that the present method may also be applicable to photosensitive elements in which the unpolymerized material is removable by washout in an aqueous-based or semi-aqueous-based development solution. To the extent that aqueous-based or semi-aqueous based development solutions have three or more components, and have discernable different values for the measured properties, the present method can be used to rebalance aqueous-based or semi-aqueous based development solutions.

The solvent solution composed of 3 or more components, each having a first mass fraction, washes out or removes the materials from the photosensitive element that will not contribute to the relief surface or structure of the printing form resulting from treating. In most embodiments, more than one photosensitive element is treated in the solvent solution contained in the processor. The removed materials, dissolved and un-dissolved, accumulate in the solvent solution, and may be referred to as a contaminated solvent solution. Collecting the solvent solution with at least the unpolymerized material therein includes directing the contaminated solvent solution to a container separate from the processor, i.e., contaminated solution reservoir. A solvent solution may be considered contaminated if the solvent solution contains at least about 1% to 15% or more, by weight of unpolymerized material and/or other materials from photosensitive elements, based on the total solvent solution. In some embodiments, contaminated solvent solution contains about 2% to about 10%, by weight contaminants. In other embodiments, the contaminated solvent solution contains about 1% to about 5% by weight contaminants.

Separating the unpolymerized portion from the solvent solution of step b) includes forming a reclaimant of the n components, wherein at least one the components of the reclaimant has a second mass fraction that is different than the first mass fraction. In most embodiments, separating the unpolymerized portion from the contaminated solvent solution is by a distilling process in which the reclaimant is a distillant. Distilling is a method of separating mixtures based on differences in their volatilities in a boiling liquid mixture. Separation by distillation of solvent solutions is within the ordinary skill of those in the art. Distillation separates the contaminants of undissolved materials and dissolved materials from the solvent solution. In other embodiments, separating is by centrifuging, optionally followed by filtration. In yet other embodiments, separation can be effected by the addition of a coagulant to the contaminated solution that would result in a preferential precipitation of the dissolved material that can be then removed by filtering. In yet other embodiments, separation can be accomplished by microfiltration. Separating by centrifuging, as well as by ordinary filtration will typically clean the contaminated solvent solution by removing undissolved materials, such as particles of unpolymerized material, from the contaminated solvent solution, but generally will not remove those materials that have been dissolved into the solvent solution. The present method for rebalancing a solvent solution that is separated by centrifuging and/or filtering is suitable provided that the amount of the dissolved materials in the contaminated solvent solution is relatively small, that is less than 5%, preferably less than 3%, most preferably less than 1.5% by weight of the contaminated solvent solution.

After separating the contaminating materials from the contaminated solvent solution, a volume of the reclaimant solution is collected and measured. The reclaimant is essentially a cleaned solvent solution, that is, a solvent solution in which a majority of undissolved and dissolved materials from the photosensitive element have been removed. In most embodiments, the reclaimant includes all the components, n, that were present in the startup or initial solvent solution. In some embodiments, the reclaimant includes less than all the components that were present in the startup or initial solvent solution. As different solvents (i.e., first and second active components, and diluent) have different affinity for the photopolymerizable material, the composition of the solvent solution (i.e., reclaimant) is altered by the separation process. All (if present in a small proportion) or some portion of one or more components of the solvent solution captured in the wastes of the separation step. The contaminated solvent solution may loose portion/s of components by other means throughout the washout process or reclamation process, such as, evaporation, absorption, adsorption, etc. In both embodiments, the proportion of at least one of the components in the reclaimant are not the same as the proportion of the component in the solvent solution that was provided. As such, in most embodiments, each of the components in the reclaimant has a mass fraction (i.e., second mass fraction) that is different than the first mass fraction in the provided solvent solution.

Measuring the reclaimant, which has 3 or more components, for more than one property provides an estimate of the degree of change in the proportions of each of the components in the reclaimant. The reclaimant is measured for n−1 properties. In one embodiment, the reclaimant is measured for n−1 properties, wherein all n−1 properties are measured the same temperature. Thus, if the composition of the reclaimant (and the solvent solution) has three components, two properties of the reclaimant are determined at the same temperature. Similarly, if the composition of the reclaimant (and the solvent solution) has four components, three properties of the reclaimant are measured.

In most embodiments, the properties of the reclaimant that are measured are physical characteristic properties of a solvent solution that change as the proportion of the components in the composition changes. Examples of properties of the reclaimant that can be measured to determine the change in proportions of each of the components include specific gravity, index of refraction, and dielectric constant. In one embodiment, the properties are measured at the same temperature. In another embodiment, each property is measured at a different temperature.

The specific gravity is the ratio of the density of a material to the density of some standard material, such as water at a specified temperature. A hydrometer is used to measure the specific gravity of a liquid, such as the solvent solution and reclaimant.

The dissolution of materials in solvents changes not only the specific gravity of the solvent, but also its optical properties, such as the refractive index. The refractive index (RI) of a material is defined as the ratio of the speed of light in vacuum to that in the material. Refractive index of the reclaimant (and solvent solution) is measured with a refractometer. In some embodiments, an Abbe refractometer that is established per ASTM D542 can be used. The Brix scale is a popular scale derived from the refractive index of a solution at 20° C. and is commonly used in a number of industries. One of he most common uses of Brix is in the determination of concentration of solutions. Commercially available refractometers can provide both refractive index and Brix of the solution under examination. In some embodiments, the Brix scale on the refractometer is convenient to use because fewer digits are needed to the right of the decimal point, and hence the chance of recording errors or truncation is less significant. The refractive index and Brix are both sensitive to temperature and if the solution temperature cannot be controlled, then refractometers with built-in automatic temperature compensation must be used. Modern optical Brix and refractometers may be of two types: analog (Abbe type) or digital, and are also available as bench top (for use in laboratory settings) or portable. Portable refractometers are the easiest to use in the field and the one available from Misco (Model PA 202) is particularly useful in the present invention.

The dielectric constant is a ratio of the capacitance of a capacitor filled with a given dielectric to that of the same capacitor having only a vacuum as dielectric. A capacitance meter or impedance bridge can be used to measure the dielectric constant of a liquid, such as a solvent solution and reclaimant. Suitable field or hand-held devices for use as a capacitance meter or impedance bridge are available from Brookhaven Instruments Corp. as model BI-870 dielectric constant.

Although laboratory or bench instruments can be used to measure the properties, it is preferred that the properties are measured using hand-held devices or field devices for its simplicity, ease of use, and immediacy of results at printing form production facilities.

Generating an equation for each measured property relative to each of the n components is accomplished by conducting a series of experiments in which the proportions of the components in a solvent solution composition are varied in a known (or prescribed) way and the desired properties are measured for each varied composition. The generation of the equations for each measured property may be considered modeling of the solvent solution. In most embodiments, a manufacturer of the solvent solution would generate the equations. However, it is possible that the equations could be generated by others provided that the components in the solvent solution are known or could be determined. The equations can be generated by any suitable methodology, including but not limited to, repetitive trials at incremental concentrations of each component, and by statistically designed methodology. The equations should be generated based upon a representative range of compositions of the solvent solution that one expects to encounter in the field. This may include taking into consideration one or more of the variety of processor systems which use the solvent solution, the method for separating the contaminants from the solvent solution, the volume and/or types of photosensitive elements that are processed in the solvent solution, the amount of material (i.e., photosensitive elements) processed between reclamation or adjustments, and the number of reclamation cycles between adjustments, etc. The representative range of compositions covers the desired composition and compositions expected to result from one or more iterations of the reclamation process. A plurality of solvent solutions is prepared, i.e., experimental compositions, each having a different composition in which each of the n components are varied within the representative range. It is possible, and acceptable, that one or more of the experimental compositions represent a combination of components that is not particularly effective at removing material/s from a photosensitive element. In most embodiments, a design of experimentation (DOE) provides the framework for the series of experiments on the solvent solution compositions in order to generate the necessary equations. As an example for a solvent solution having 3 components, a series of 10 DOE trial solvent solutions are prepared in which each component is varied in a range of expected functionality at one or more low, moderate, and high mass fraction values.

Each mixture composition of the 10 DOE trial solvent solutions is measured for the desired properties, such as specific gravity and refractive index, and the data recorded for fitting into a linear regression analysis. Since these particular properties are temperature sensitive, a temperature of the solvent solutions is held constant for a series of the 10 DOE trial solvent solutions. Additional series can be repeated by measuring the same properties with the 10 DOE trial solvent solutions, but the solvent solutions are measured at different temperatures, over a range which is representative of possible temperature in-use of the reclaimant. The number of trial solvent solution compositions made and design of experiment would change appropriately as the number of components in the solvent solution change. It is well within the skill of those in the art to determine the number of trial compositions and the design of experimentation for a solvent solution having 4 or more components.

The data, i.e., each measured property for each trial composition, are fit using linear regression with mass fraction of two of the components and optionally temperature as the independent variables. In cases where there are more than 3 components in the solvent solution, the regression for an n component solution would use n−1 mass fractions and optionally temperature as independent variables. The equations generated describe the influence of the composition and optionally temperature on the measured properties. In one embodiment, since two of the three components are linearly independent (the third component is defined by the first two components), each regression fit the measured property against the first active component, the second active component, and the temperature. But any two of the three components can be selected for inclusion into the equations.

In embodiments for solvent solutions having 3 components and n−1 properties are measured, an example form of the equations generated by the regression analysis is $$Y_1 = A_0 + A_1 x_1 + A_2 x_2 + A_3 T_1 \quad (1)$$

$$Y_2 = B_0 + B_1 x_1 + B_2 x_2 + B_3 T_2 \quad (2)$$

where $x_3$, which is the mass fraction of the third component of the solvent solution, has been eliminated from the equations (1) and (2) using the sum of the mass fractions of the components equals 100%, and wherein
$Y_1$ represents first measured property, such as specific gravity,
$Y_2$ represents second measured property, such as refractive index,
$x_1$ is mass fraction of the first active component,
$x_2$ is mass fraction of the second active component,
$T_1$ is temperature of the reclaimant when measuring first property,
$T_2$ is temperature of the reclaimant when measuring second property,
$A_0, A_1, A_2, A_3$ are constants derived from the linear regression of the data of the first measured property, and
$B_0, B_1, B_2, B_3$ are constants derived from the linear regression of the data of the second measured property.

It is well within the ability of one skilled in the art to assess the goodness of fit of the regression equations and ascertain if additional terms would be required to represent the observed data over the range investigated. The presence of such higher order terms (e.g. $x_1^2$ or $x_1 x_2$, etc) make the mathematics more complicated but do not fundamentally alter the process for estimating the composition of the reclaimed solution.

In one embodiment where the solvent solution, and reclaimant, includes three components, in which the first active component is an alkyl acetate, the second active component is benzyl alcohol, and the third active component is a hydrotreated petroleum fraction of hydrocarbons having 6 to 13 carbon atoms, the equations generated from a DOE with the measured properties of specific gravity and refractive index, are Specific Gravity=$0.762 + 0.127 x_1 + 0.284 x_2 - 0.000991$ Temp. (° C.)

Refractive index=$1.43 - 0.00434 x_1 + 0.0998 x_2 - 0.000382$ Temp. (° C.)

wherein the range of compositions used varied from 45% to 70% for the first active component, 15% to 40% for the second active component, and 15% to 40% for the diluent. For each series the measurement of each property was at a constant temperature, but several series were conducted in which the properties were measured at different temperatures, in increments of 5 degrees from 20 to 35° C.

Using the equations generated from measured properties from the DOE trials and the measured properties of the reclaimed solution, the proportions (i.e., mass fraction) of the components in the composition of the reclaimant can be estimated. Mathematically, knowing $A_0, A_1, A_2, A_3, B_0, B_1, B_2$, and $B_3$ from the regression analysis of the laboratory data (or DOE trials), and measuring $Y_1, Y_2, T_1$ and $T_2$, for the reclaimed solvent mixture, one can solve equations (1) and (2) for $x_1$ and $x_2$. In most embodiments, generating an equation for each measured property relative to the components in a solvent solution is accomplished by the manufacturer of the solvent solution. The equations can be provided to a customer at a printing form production facility or party who recovers contaminated solvent solutions for customers as a spreadsheet having equations to calculate the output based upon the measured properties of particular reclaimant. The field measurements of the properties, $Y_1, Y_2$ and temperature/s, $T_1$ and $T_2$, of the reclaimant are entered into the spreadsheet, which calculates from the equations the mass fraction of each of the components in the reclaimant. Depending upon the fit of the equations to the data (i.e., r-value), the calculated mass fraction of the each of the components is a reasonable estimation of the actual mass fraction of the components in the reclaimant. In addition, to have good predictive abilities, the regression equations need to show different responses to changes in composition. If both properties change similarly as the composition is changed, the regression equations may each fit the experimental data well, but do a poor job of predicting the composition that give rise to particular sets of measured properties. Mathematically this is the notion of orthogonality that is familiar to those skilled in the art of data analysis. If the chosen properties are not sufficiently different in their dependence on the composition, other choices of properties may need to be made.

Since the mass fraction of the each of the components in the reclaimant has been estimated, the reclaimant can be adjusted to a target composition such that it can be returned to the processor system and expected to (continue) effectively remove unpolymerized material and other materials from photosensitive elements by washout. Should the composition be within an acceptable range for the target composition, the following adjustment procedure may be deemed unnecessary, though subsequent reclamation steps will likely push the composition into a range that an adjustment may be required.

Calculating a mass of at least one of the components to be added to the reclaimant determines the adjustment necessary to bring the proportion of the component(s) in the reclaimant to a targeted proportion in the target composition. The calculations can be conducted by equations which were entered in the spreadsheet and provide an output of the possible addition of each of the components to be added to the reclaimant. The total mass of the reclaimant solution (M) is calculated from the total volume of the reclaimant solution and its density. Having already measured the specific gravity of the reclaimant solution, simple multiplication by the density of water at the measured temperature will give the density of the reclaimant solution. The mass of each component in the reclaimant solution ($m_1$, $m_2$, ...) can be calculated by multiplying the estimated mass fraction ($x_1$, $x_2$, ...) of each component times the total mass of the reclaimant solution, $$m_i = M^* x_i$$

Since concentrating the reclaimant is impractical, the addition of one or more components is a dilution to bring the reclaimant to the target composition. For each component, dividing the mass of that component ($m_i$) by the mass fraction of a target composition for that component ($y_i$) will give the minimum mass ($W_i$) that will adjust the reclaimant solution to have the target fraction of that component.

$$W_i = m_i / y_i$$

The minimum mass Wi is determined for each component, and the largest value of the minimum mass Wi to adjust the reclaimant is selected as the adjusted reclaimant mass W. For each component of the reclaimant, the total mass ($z_i$) of the component to be added to reach the target composition is the difference of the amount (by mass) needed in an adjusted reclaimant solution (i.e., targeted composition solution) from the amount (by mass) that is present in the reclaimant solution. So for each component of the reclaimant, the total mass ($z_i$) of the component needed to be added to the reclaimant to reach the target composition is calculated from the selected adjusted reclaimant mass (W) times the mass fraction of the component ($y_i$) of the targeted composition, minus the reclaimant mass (M) times the mass fraction of the component ($x_i$) in the reclaimant solution, as shown in the following equation.

$$z_i = (W)(y_i) - (M)(x_i)$$

In most embodiments the calculations are done based upon mass fractions, since mass is conserved upon mixing of materials. Even though volume may not always be conserved upon mixing of materials, it is also contemplated that the calculations can be done based upon volume fractions instead of mass fractions, provided that any relevant volume changes from mixing are understood. One could expect that the error associated with changes in volume would be relatively small, but use of mass fractions avoids the potential complication.

For convenience, the required additions can be converted from mass to volume using the density of the pure components. In most embodiments, each component of the solvent solution is provided as a separate solution for purposes of adding the component/s to the reclaimant and rebalancing the reclaimant to the targeted composition. In some embodiments, the first active component, the second active component, and the diluent are each provided as a separate solution, and a solution that is a combination or mixture of the one or more additional components is provided for adding the components to the reclaimant solution. In yet other embodiments, the first active component and the second active component are each provided as a separate solution, and a solution that is a combination or mixture of the diluents and the one or more additional components is provided for adding the components to the reclaimant solution. The mass, $z_i$, (or volume) of each component solution is added to the reclaimant to adjust the reclaimant to the targeted composition.

Adding the mass of at least one of the components to the volume of the reclaimant adjusts the second mass fractions from of each of the components in the reclaimant to the target composition having each of the components with mass fraction, $y_i$. The target composition represents a range of compositions of the solvent solution that will provide good desired washout performance as described above. In some embodiments, adding the mass of at least one component to the volume of the reclaimant adjusts the second mass fractions of the reclaimant to a target composition that is equal to the first mass fractions of the solvent solution. In other embodiments, adding the mass of at least one component to the volume of the reclaimant adjusts the second mass fractions of the reclaimant to a target composition that has mass fractions of the components which are different from the first mass fractions of the solvent solution. It may not be necessary to adjust the reclaimant to the initial proportions of the solvent solution in order to assure continued effective removal of materials from photosensitive elements.

Photosensitive Element

The photosensitive element or precursor includes at least one layer of a photopolymerizable composition. The term "photosensitive" encompass any system in which the at least one photosensitive layer is capable of initiating a reaction or reactions, particularly photochemical reactions, upon response to actinic radiation. In some embodiments, the photosensitive element includes a support for the photopolymerizable layer. In some embodiments, the photopolymerizable layer is an elastomeric layer that includes a binder, at least one monomer, and a photoinitiator. In some embodiments, the photosensitive element includes a layer of an infrared sensitive material which can also function as an actinic radiation opaque material adjacent the photopolymerizable layer, opposite the support.

Unless otherwise indicated, the term "photosensitive element" encompasses printing precursors capable of undergoing exposure to actinic radiation and treating to form a surface suitable for printing. Unless otherwise indicated, the "photosensitive element" and "printing form" includes elements or structures in any form which become suitable for printing or are suitable for printing, including, but not limited to, flat sheets, plates, plates-on-sleeves, and plates-on-carriers. It is contemplated that printing form resulting from the photosensitive element has end-use printing applications for relief printing, such as flexographic and letterpress printing. Relief printing is a method of printing in which the printing form prints from an image area, where the image area of the printing form is raised and the non-image area is depressed or recessed.

The photosensitive element includes at least one layer of a photopolymerizable composition. As used herein, the term "photopolymerizable" is intended to encompass systems that are photopolymerizable, photocrosslinkable, or both. The photopolymerizable layer is a solid elastomeric layer formed of the composition comprising a binder, at least one monomer, and a photoinitiator. The photoinitiator has sensitivity to actinic radiation, which includes ultraviolet radiation and/or visible light. The solid layer of the photopolymerizable composition is treated with one or more solutions to form a relief suitable for flexographic printing. As used herein, the term "solid" refers to the physical state of the layer which has a definite volume and shape and resists forces that tend to alter its volume or shape. The layer of the photopolymerizable composition is solid at room temperature, which is a temperature between about 5° C. and about 30° C. The photosensitive element includes embodiments in which the photosensitive element has not been exposed to actinic radiation, and the photosensitive element has been exposed to actinic radiation. As such the photosensitive element can include embodiments in which the layer of the photopolymerizable composition includes unpolymerized portion/s; or polymerized portion/s (i.e., photohardened or cured); or both polymerized portion/s and unpolymerized portion/s.

The binder is not limited and can be a single polymer or mixture of polymers. In some embodiments, the binder is an elastomeric binder. In other embodiments, the binder becomes elastomeric upon exposure to actinic radiation. Binders include natural or synthetic polymers of conjugated diolefin hydrocarbons. In some embodiments, the binder is an elastomeric block copolymer of an A-B-A type block copolymer, where A represents a non-elastomeric block, and B represents an elastomeric block. The non-elastomeric block A can be a vinyl polymer, such as for example, polystyrene. Examples of the elastomeric block B include polybutadiene and polyisoprene. The binder is at least soluble, swellable, or dispersible in organic solvent washout solutions.

Either a single elastomeric material or a combination of materials can be used for the elastomeric layer so long as the characteristics desired for relief printing are obtained. Examples of elastomeric materials are described in *Plastic Technology Handbook*, Chandler et al., Ed., (1987). In many cases it may be desirable to use thermoplastic elastomeric materials to formulate the elastomeric layer. When a thermoplastic elastomeric layer is reinforced photochemically, the layer remains elastomeric but is no longer thermoplastic after such reinforcement. This includes, but is not limited to, elastomeric materials such as copolymers of butadiene and styrene, copolymers of isoprene and styrene, styrene-diene-styrene triblock copolymers.

The photopolymerizable composition contains at least one compound capable of addition polymerization that is compatible with the binder to the extent that a clear, non-cloudy photosensitive layer is produced. The at least one compound capable of addition polymerization may also be referred to as a monomer. Monomers that can be used in the photopolymerizable composition are well known in the art and include, but are not limited to, addition-polymerization ethylenically unsaturated compounds with at least one terminal ethylenic group. The composition can contain a single monomer or a combination of monomers. Monomers can be appropriately selected by one skilled in the art to provide suitable elastomeric and other properties to the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators may be used. Alternatively, the photoinitiator may be a mixture of compounds in which one of the compounds provides the free radicals when caused to do so by a sensitizer activated by radiation. Preferably, the photoinitiator for the main exposure (as well as post-exposure and backflash) is sensitive to visible or ultraviolet radiation, between 310 to 400 nm, and preferably 345 to 365 nm.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

The thickness of the photopolymerizable layer can vary over a wide range depending upon the printing end-use application. In some embodiments, the photosensitive layer can have a thickness from about 0.005 inch to about 0.250 inch or greater (0.013 to 0.64 cm or greater). Typical thickness of the photopolymerizable layer is from about 0.045 inches to about 0.250 inches (about 0.025 cm to about 0.64 cm).

The photosensitive element typically includes a support adjacent the layer of the photopolymerizable composition. The support can be composed of any material or combination of materials that is conventionally used with photosensitive elements used to prepare printing forms. In some embodiments, the support has a thickness from 0.002 to 0.050 inch (0.0051 to 0.127 cm).

As is well known to those of ordinary skill in the art, the photosensitive element may include one or more additional layers adjacent the photopolymerizable layer, that is, on a side of the photopolymerizable layer opposite the support. Depending on desired use, the additional layers may be opaque or transparent to actinic radiation, and may have one or more functions for the photosensitive element. The additional layers include, but are not limited to, a release layer, an elastomeric capping layer, a barrier layer, an adhesion modifying layer, a layer which alters the surface characteristics of the photosensitive element, and combinations thereof. The one or more additional layers can be removable, in whole or in part, during treatment. One or more of the additional layers may cover or only partially cover the photosensitive composition layer. It is well within the ordinary skill of those in the art to select and prepare additional layers on the photopolymerizable layer according to desired end-use. The photosensitive printing element of the present invention may further include a temporary coversheet on top of the uppermost layer of the element.

Before treating, the photosensitive element is exposed to actinic radiation. The process of preparing a printing form from a photosensitive element usually (but not always) includes a back exposure or backflash step. This is a blanket exposure to actinic radiation through the support. It is used to create a layer of polymerized material, or a floor, on the support side of the photopolymerizable layer and to sensitize the photopolymerizable layer. The backflash exposure can take place before, after or during the other imaging steps. Any of the conventional radiation sources discussed for the overall (imagewise) actinic radiation exposure step can be used for the backflash exposure step. Exposure time generally range from a few seconds up to a few minutes.

Upon imagewise exposure, the radiation-exposed areas of the photopolymerizable layer are converted to the insoluble state with no significant polymerization or crosslinking taking place in the unexposed areas of the layer. Any conventional source of actinic radiation can be used for this exposure. The radiation sources generally emit long-wave UV radiation between 310-400 nm. The exposure time may vary from a few seconds to minutes, depending upon the intensity and spectral energy distribution of the radiation, its distance from the photosensitive element, and the nature and amount of the photopolymerizable material.

Imagewise exposure can be carried out by exposing the photosensitive element through an image-bearing photomask that can be a separate film, i.e., an image-bearing transparency or phototool, or be integrated with the photosensitive element as an in-situ mask formed by computer-to-plate digital imaging.

Following imagewise exposure to actinic radiation through the mask and removal of the photomask if it is a separate film, the photosensitive printing element is treated with the solvent solution to remove unpolymerized areas in the photopolymerizable layer and thereby form a relief image. Treating step removes at least the photopolymerizable layer in the areas that were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerised areas of the photopolymerizable layer. For photosensitive elements including a separate IR-sensitive layer for digital formation of the mask, the treating step that forms the relief image in the photopolymerizable layer may also remove the mask image (which had been exposed to actinic radiation).

We claim:

1. A method for rebalancing a solvent solution used for treating a photosensitive printing element having a photopolymerizable layer with an unpolymerized portion, the method comprising:
    a) providing a solvent solution that is a mixture of n components, wherein $n \geq 3$, wherein each of the components has a first mass fraction, based on a total of the first mass fractions of the components;
    b) treating the photosensitive printing element with the solvent solution;
    c) collecting the solvent solution with the unpolymerized portion therein;
    d) separating the unpolymerized portion from the solvent solution of step c) to form a reclaimant of the components, wherein at least one of the components of the reclaimant has a second mass fraction that is different than the first mass fraction;
    e) determining a volume of the reclaimant;
    f) measuring the reclaimant for $n-1$ properties;
    g) calculating the second mass fraction of each of the components in the reclaimant based on an equation generated for each measured property of step f), and based on an equation that a total of the second mass fractions of the components in the reclaimant sum to one (1);
    h) based on the calculated second mass fractions from step q) and the volume from step e), calculating a mass of at least one of the n components to be added to the reclaimant; and
    i) adding the calculated mass of the at least one of the n components from step h) to the volume of reclaimant, thereby adjusting the second mass fraction of the at least one component in the reclaimant to a target mass fraction;
    wherein the $n-1$ properties that were measured in step f) are sufficiently different in their response to changes in mass fraction of the individual components.

2. The method of claim 1 wherein the calculating step further comprises: generating an equation for each measured property of step f) relative to each of the components.

3. The method of claim 2 wherein the generating step further comprises:
    creating compositions of experimental solvent solutions having the n components, wherein the experimental compositions are representative of a range of possible mass fractions that encompass the first mass fraction for each n component;
    measuring $n-1$ properties of each of the compositions of the experimental solvent solutions to provide data; and
    conducting a linear regression on the data to generate the equation for each measured property relative to the mass fraction for the n components.

4. The method of claim 3 further comprising:
    measuring the $n-1$ properties of each of the compositions of the experimental solvent solutions at each of one or more temperatures, and the equation for each measured property is relative to the mass fraction of the n components and temperature.

5. The method of claim 1 wherein the target mass fraction of each of the components in the reclaimant resulting from step i) is equal to the first mass fraction of each of the components of the solvent solution.

6. The method of claim 1 wherein the target mass fraction of each of the components in the reclaimant resulting from step i) is a third mass fraction, different from the first mass fraction of each of the components of the solvent solution.

7. The method of claim 1 wherein the step d) comprises distilling to separate the unpolymerized portion from the solvent solution of step c) wherein the reclaimant is a distillate of the n components.

8. The method of claim 1 wherein the step d) is selected from centrifuging, filtering, or a combination of centrifuging and filtering, to separate the unpolymerized portion from the solvent solution of step c).

9. The method of claim 1 wherein the properties of the measuring step f) are selected from specific gravity, index of refraction, or dielectric constant.

10. The method of claim 1 wherein the measuring of the reclaimant for $n-1$ properties further comprises determining a temperature of the reclaimant, and the equation generated for each measured property is relative to each of the n components and the temperature.

11. The method of claim 1 wherein the measuring step f) further comprises using a hand-held device for measuring the properties of the reclaimant.

12. The method of claim 1 wherein the solvent solution comprises a hydrocarbon for removing the unpolymerized portion from the element, an alcohol, and a diluent.

13. The method of claim 12 wherein the hydrocarbon is selected from chlorohydrocarbons, aromatic hydrocarbons, saturated cyclic hydrocarbons, saturated acyclic hydrocarbons, unsaturated cyclic hydrocarbons, and lower aliphatic ketones.

14. The method of claim 12 wherein the alcohol is selected from aliphatic alcohols, alicyclic alcohols, aromatic alcohols, heterocyclic alcohols, polycyclic alcohols, trihydric alcohols, and polyhydric alcohols.

15. The method of claim 12 wherein the diluent is selected from petroleum distillates, naphthas, paraffinic solvents, hydrotreated petroleum distillates, mineral oil, mineral spirits, ligroin, decane, octane, and hexane.

16. The method of claim 1 wherein the solvent solution comprises an alkyl acetate, an alcohol having a boiling point $\geq 135°$ C., and a diluent.

17. The method of claim 1 further comprising returning the reclaimant resulting from step i) to the solvent solution.

18. The method of claim 1 wherein the providing step a) comprises treating the photosensitive printing element in the solvent solution o remove the unpolymerized portion from the layer.

19. A method for rebalancing a solvent solution used for treating a photosensitive printing element having a photopolymerizable layer with an unpolymerized portion, the method comprising:
    a) forming a reclaimant from a solvent solution, that has been used to treat the photosensitive printing element, the solvent solution comprising a mixture of n components, wherein $n \geq 3$ and each of the components of the solvent solution has a first mass fraction, based on a total of the first mass fractions of the components, and wherein at least one of the components of the reclaimant has a second mass fraction that is different than the first mass fraction;

b) determining a volume of the reclaimant;

c) measuring the reclaimant for n−1 properties;

d) calculating the second mass fraction of each of he components in the reclaimant based on an equation generated for each measured property of step c), and based on an equation that a total of the second mass fractions of the components in the reclaimant sum to one (1);

e) based on the calculated second mass fractions from step d) and the volume from step b), calculating a mass of at least one of the n components to be added to the reclaimant; and f) adding the mass of the at least one of the n components from step e) to the volume of reclaimant, thereby adjusting the second mass fraction of the at least one component in the reclaimant to a target mass fraction;

wherein the n−1 properties that were measured in step c) are sufficiently different in their response to changes in mass fraction of the individual components.

* * * * *

UNITED STATES PATENT AND TRADEMARK OFFICE
CERTIFICATE OF CORRECTION

PATENT NO. : 8,349,185 B2
APPLICATION NO. : 12/908475
DATED : January 8, 2013
INVENTOR(S) : Mark A Hackler et al.

It is certified that error appears in the above-identified patent and that said Letters Patent is hereby corrected as shown below:

In the Claims:

Column 19, line 41, "(q)" should read -- g) --.

Signed and Sealed this
Fourth Day of June, 2013

Teresa Stanek Rea
*Acting Director of the United States Patent and Trademark Office*